United States Patent
Keckler et al.

(10) Patent No.: US 9,058,453 B2
(45) Date of Patent: Jun. 16, 2015

(54) SYSTEM AND METHOD FOR CONFIGURING A CHANNEL

(71) Applicant: NVIDIA Corporation, Santa Clara, CA (US)

(72) Inventors: Stephen William Keckler, San Jose, CA (US); William J. Dally, Los Altos Hills, CA (US); Steven Lee Scott, Eau Claire, WI (US); Brucek Kurdo Khailany, Austin, TX (US); Michael Allen Parker, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/902,701

(22) Filed: May 24, 2013

(65) Prior Publication Data

US 2014/0351780 A1    Nov. 27, 2014

(51) Int. Cl.
    *G06F 17/50* (2006.01)
(52) U.S. Cl.
    CPC .................................. *G06F 17/5054* (2013.01)
(58) Field of Classification Search
    USPC .......................................................... 716/117
    See application file for complete search history.

(56) References Cited

U.S. PATENT DOCUMENTS

| | | | |
|---|---|---|---|
| 5,952,839 A | 9/1999 | Fredrickson | |
| 7,111,265 B1 * | 9/2006 | Tan et al. | 716/121 |
| 7,308,664 B1 * | 12/2007 | Fung et al. | 716/114 |
| 8,327,199 B1 | 12/2012 | Dastidar et al. | |
| 8,555,230 B2 * | 10/2013 | Catuogno | 716/126 |
| 8,661,401 B1 * | 2/2014 | Ogami et al. | 716/139 |
| 2003/0107397 A1 | 6/2003 | Piasecki et al. | |
| 2004/0128626 A1 * | 7/2004 | Wingren et al. | 716/1 |
| 2005/0204224 A1 | 9/2005 | Piasecki et al. | |
| 2005/0237083 A1 | 10/2005 | Bakker et al. | |
| 2008/0109782 A1 * | 5/2008 | Adelman et al. | 716/16 |
| 2010/0218157 A1 * | 8/2010 | McMurchie et al. | 716/13 |

OTHER PUBLICATIONS

Atmel, "8-bit Atmel Microcontroller with 128KBytes In-System Programmable Flash: ATmega128 ATmega128L," 2467X-AVR-06/11, Jun. 2011, pp. 66.
XILINX, "7 Series FPGAs Overview," Advance Product Specification, DS180 (v1.13), Nov. 30, 2012, pp. 1-16.
International Search Report and Written Opinion from International Application No. PCT/US14/39452, dated Oct. 10, 2014.

* cited by examiner

*Primary Examiner* — Suresh Memula

(74) *Attorney, Agent, or Firm* — Zilka-Kotab, PC

(57) ABSTRACT

A system and method are provided for configuring a plurality of pin resources. The method includes identifying a plurality of pin resources of a primary application specific integrated circuit (ASIC) device and configuring the plurality of pin resources based on a pin distribution between a first interface and a second interface, where the first interface provides a first communication path between the primary ASIC device and a first device, and the second interface provides a second communication path between the primary ASIC device and a second device.

17 Claims, 10 Drawing Sheets

SYSTEM AND METHOD FOR CONFIGURING A CHANNEL

This invention was made with Government support under LLNS subcontract B599861 awarded by DOE. The Government has certain rights in this invention.

FIELD OF THE INVENTION

The present invention relates to channels used in data communications.

BACKGROUND

Over time, the function of some system components of a computing system has been integrated into the processor chip. Today, such functions include that of memory controllers, network interface controllers, and general-purpose I/O interfaces. For example, conventional high-end graphics processing units now include as many as six memory controllers along with a Peripheral Component Interconnect Express (PCIe) controller. When the memory controllers are integrated into the processor chip, many hundreds of off-chip pins are needed to connect the memory controllers to external memory devices, such as dynamic random access memory (DRAM). Even when the number of off-chip pins for an interface is reduced, the number of off-chip pins continues to increase as more system components are integrated into the processor chip. For example, when a network interface controller is integrated into a processor chip, off-chip pins needed to couple the network interface controller to a router are added to the processor chip and the off-chip pins that provided the PCIe interface to the network interface controller are retained to enable communication between the processor and other system components.

Thus, there is a need for improved utilization of off-chip pins and/or addressing other issues associated with the prior art.

SUMMARY

A system and method are provided for configuring a plurality of pin resources. The method includes identifying a plurality of pin resources of a primary application specific integrated circuit (ASIC) device and configuring the plurality of pin resources based on a pin distribution between a first interface and a second interface, where the first interface provides a first communication path between the primary ASIC device and a first device, and the second interface provides a second communication path between the primary ASIC device and a second device.

DETAILED DESCRIPTION

Conventional application specific integrated circuit (ASIC) devices include off-chip pins that are specific to particular input/output (I/O) interfaces. For example, the pins connected to a memory controller and the pins connected to an I/O interface such as PCIe are distinct, meaning that the number of pins (and hence the bandwidth to memory and I/O) is determined at design time and cannot be changed after the chip is fabricated. Oftentimes, different system configurations require different interface configurations. For example, a variety of system configurations may be defined that have different ratios of memory, network, non-volatile storage, and general-purpose I/O bandwidth, depending on the applications to be run on the particular system. Unfortunately, when the number of pins needed for each interface varies between the different systems, a different die is fabricated to produce a device having the particular pin configuration needed for each system.

In accordance with one possible embodiment, instead of implementing an ASIC device with pins that are distinct for each interface, the pins may be implemented in a configurable manner, so that one design may be fabricated for different systems. The pins may be configured to serve as connections to memory, connections to the network, or connections to other I/O to match the demands of the system in which the device is used. The pins may be configured for the different systems based on the bandwidth requirements of each of the different interfaces. Further, in one embodiment, the pins in a given system may be reconfigured in the field, to adapt to varying ratios of the interface bandwidths for different applications.

Figure 1:
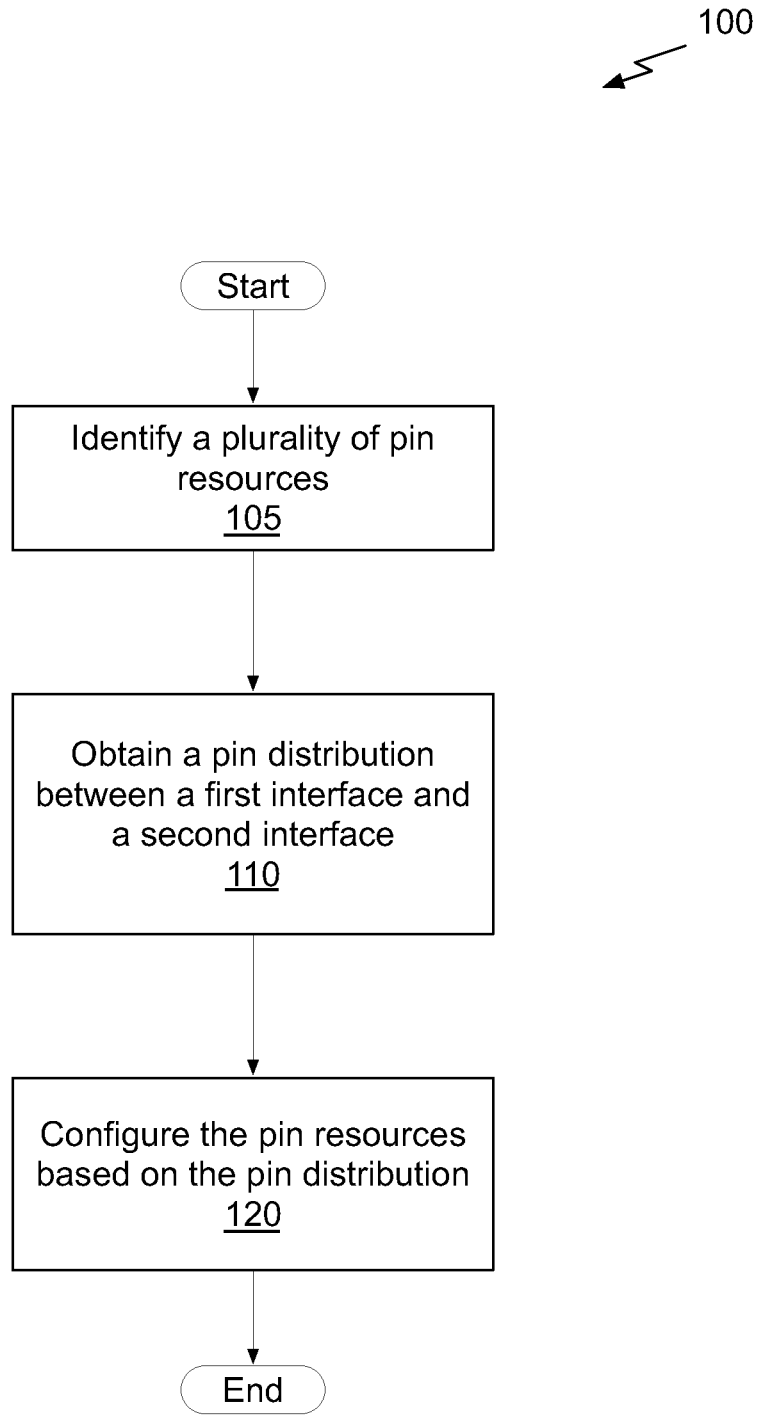
FIG. 1 illustrates a flowchart of a method for configuring a plurality of pin resources, in accordance with one embodiment.

FIG. 1 illustrates a flowchart 100 of a method for configuring a plurality of pin resources, in accordance with one embodiment. At operation 105, a plurality of pin resources of a primary ASIC device is identified. At step 110, a pin distribution between a first interface and a second interface is obtained, where the first interface provides a first communication path between the primary ASIC device and a first device, and the second interface provides a second communication path between the primary ASIC device and a second device.

At step 120, the pin resources are configured based on the pin distribution. The off-chip pins in the plurality of pin resources may be configured to provide a communication channel between either the primary ASIC device and the first device or the primary ASIC device and the second device. One or more additional sets of pin resources may be configured to provide additional communication channels, as needed, based on the pin distribution.

In one embodiment, the pin distribution may be replaced with a bandwidth distribution that is a ratio or a percentage distribution between a memory interface and a network interface. The bandwidth may be measured in bits/second or some other unit of data transfer over time or a width of a bus over a clock rate at which the bus is operated.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

A device may include one or more sets of pins that can be deployed to provide either a communication channel for a storage system, such as memory, or a communication for off-chip I/O, such as a network link. For systems in which the electrical specifications of the storage and I/O interfaces are the same, the pin drivers and receivers on the ASIC device can be shared. If the electrical interfaces are different, the ASIC device may include electrically reconfigurable transmitter and receiver circuits. Alternatively, the transmitter and receiver circuits within the ASIC device may be replicated and connected to the external pad via multiplexing circuits. The pad is a pin resource that is coupled to the physical pin that interfaces between a wire of an integrated circuit and an external wire of a system substrate to which the integrated circuit and one or more other integrated circuits are coupled. For example, a pin may be included as part of a package housing the fabricated die for an ASIC device via a wire bond or ball bump. Alternatively, a pin may be implemented as a through silicon via (TSV) when the device is a die that is included as part of a chip stack.

When the number of pins for a device is large, the size of the fabricated die may be determined by the area occupied by the pads which are typically positioned around the die perimeter in a pad ring rather than by the circuitry implemented within the pad ring. Therefore, some conventional ASIC devices include pads for multiple interfaces and only couple ("bond out") a subset of the pads to pins to manufacture different variations of the ASIC device for different systems. For example, pads may be fabricated in a conventional ASIC device for a 128-bit memory interface to provide a single ASIC device for multiple system configurations. A low-end system configuration may only "bond out" 32 bits of the memory interface while all 128 bits are "bonded out" for a high-end system configuration. Drawbacks of including extra pads in the ASIC device is that the size of the die and resulting cost increases due to the area consumed by the extra pads that are not always needed. Also, the pads are dedicated to a particular interface and cannot necessarily be redeployed for use by another interface.

In the context of the present description a configurable channel refers to a communication channel between two devices that is provided by configurable pin resources. In some optional embodiments, the configurable channels may or may not enable high-performance fixed internal logic, such as circuitry that embodies a memory controller or a network interface controller, to be connected flexibly to external devices. Further, in other embodiments, the configurable channels may enable a single ASIC chip to fulfill two different system requirements by repurposing the pins of the ASIC chip and may or may not require the overhead in terms of programmable circuitry that is needed to provide a fully-reconfigurable architecture, such as an field-programmable gate array (FPGA). The pin resources for the configurable channels may or may not only be configurable to support a small set of different I/O standards and it may or may not be necessary for all of the signal pins of the ASIC chip to be configurable.

Figure 2A:
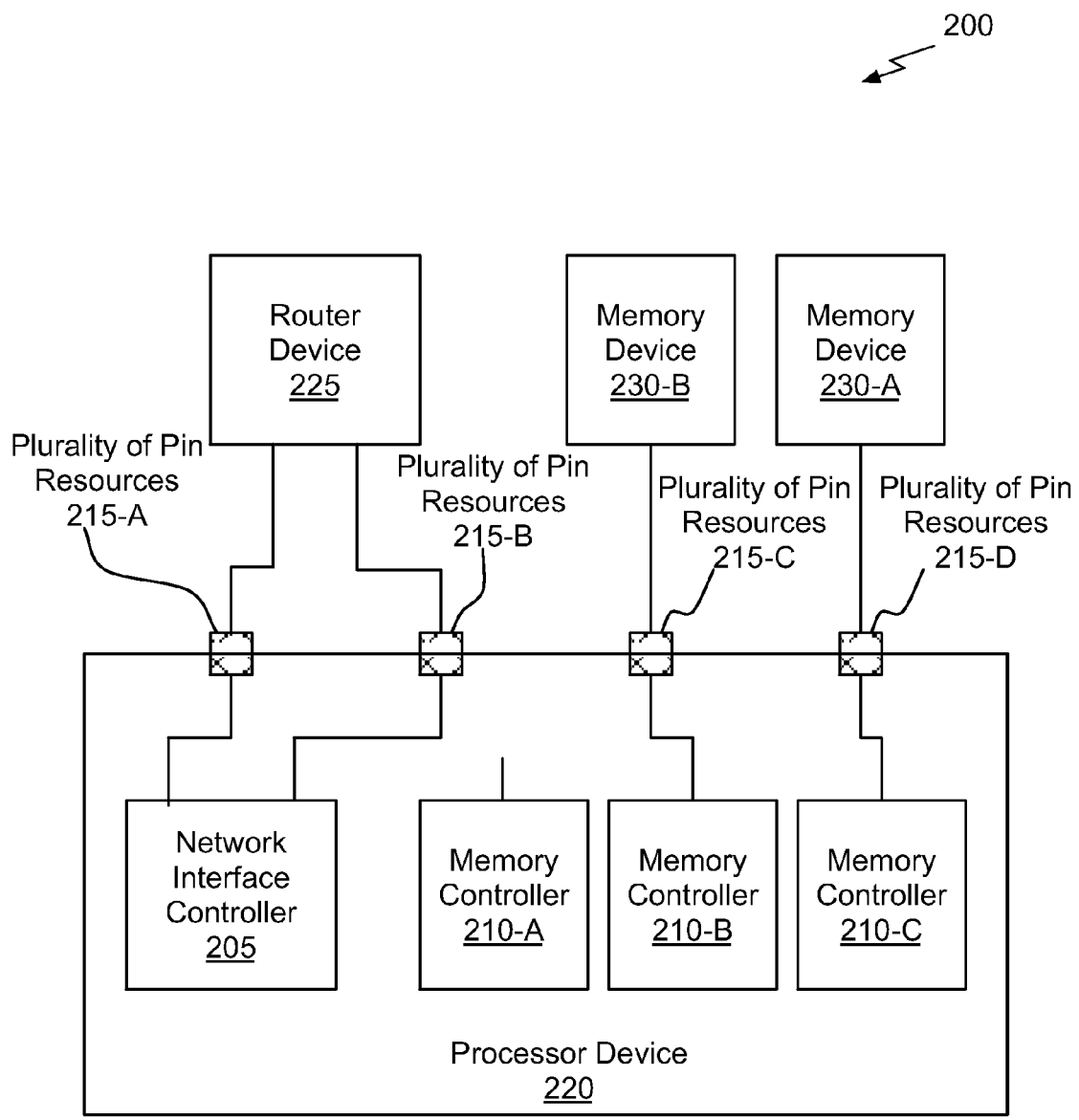
FIG. 2A illustrates a diagram of a system including a processor device with pin resources that provide a channel configuration, in accordance with one embodiment.

FIG. 2A illustrates a diagram of a system 200 including a processor device 220 with pin resources that provide a channel configuration, in accordance with one embodiment. Each plurality of pin resources 215 represents a bundle of pads that are coupled to pins dedicated to a particular channel coupling an interface of the processor device 220 to an interface of another device. The processor device 220 is an ASIC device that includes a network interface controller (NIC) 205 and one or more memory controllers 210. The network interface controller 205 and the memory controllers 210 are circuits that are designed to perform particular functions and may be implemented using custom circuits or standard cells. Once the integrated circuits of the processor device 220 are fabricated to produce a die, the circuitry that embodies a memory controller 210 cannot be modified to convert the circuitry into a network interface controller 205. In another embodiment, a processor device may include one or more memory controllers 210 and multiple NICs 205.

Each plurality of pin resources 215 may be configured to provide a communication channel for either the network interface controller 205 or the memory controller 210. As shown in FIG. 2A, the sets of pin resources 215-A and 215-B are coupled to the network interface controller 205 to provide two configurable channels between the network interface controller 205 and a router device 225. The sets of pin resources 215-C and 215-D are each coupled to two of three controllers 210 in a storage system to provide a configurable channel between the memory controller 210-B and a memory device 230-B, and the memory controller 210-C and a memory device 230-A. In the system 200, the extra memory controller 210-A is disabled and may be gated off from a power supply and/or clock. The memory devices 230 may be implemented as DRAM devices, non-volatile memory, storage devices, or any other memory, for that matter. In one embodiment, one or more of the memory devices 230 or the network interface controller 205 may be replaced with an I/O device such as a sensor.

The processor device 220 may be fabricated and then configured differently for use in different systems when each system is manufactured. As shown in FIG. 2A, the pin distribution between memory interfaces and network interfaces is equal. Each plurality of pin resources 215 can be selectively coupled to one of the network interface controller 205 or a memory controller 210, to provide one or more communication channels between the router device 225 and/or the memory devices 230, respectively. Therefore, the plurality of pin resources 215 may be configured based on a distribution of pins to provide a desired memory bandwidth and network bandwidth. To enable a variable amount of memory bandwidth, extra memory controllers 210 may be included in the processor device 220 that are enabled when respective sets of pins resources 215 are allocated to the storage system. Alternatively, the width of the memory interface can vary by allocating one or more sets of pin resources 215 to each memory controller 210, so that a memory controller may operate an interface (i.e., memory bus) at variable width, for example at 32, 64, or 96 bits. The network interface controller 210 can manage variations in available sets of pin resources 215 by adjusting the network channel widths or the number of network slices connected to the router device 225. While enabling variable amounts of bandwidth requires over-provisioning the circuitry of the processor device 220 by including extra memory controllers 210 and network controllers 205, unused circuitry can be power-gated to eliminate static and dynamic power draw when the circuitry is not used.

Figure 2B:
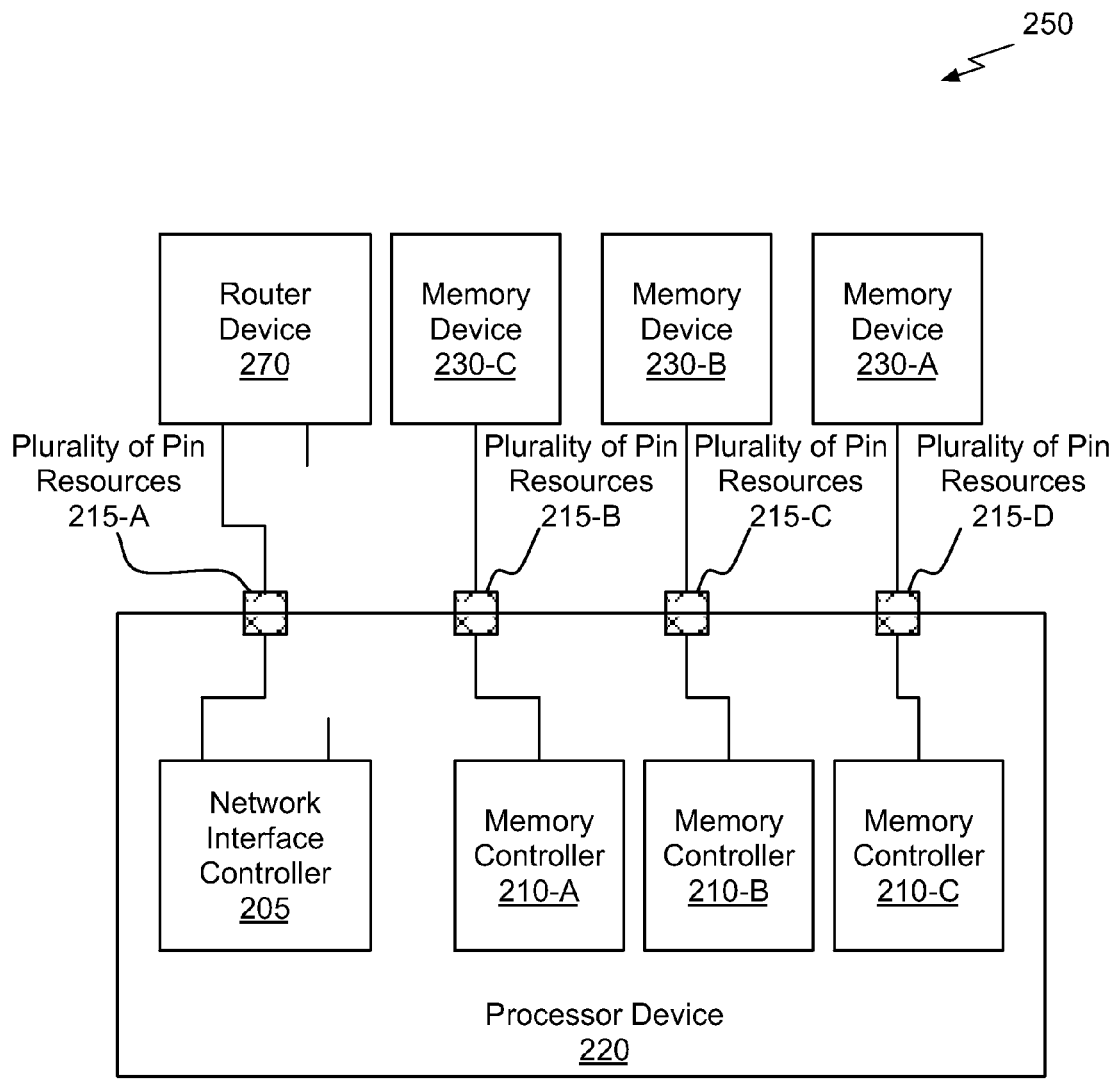
FIG. 2B illustrates a diagram of another system including a processor device with pin resources that provide a channel configuration, in accordance with one embodiment.

FIG. 2B illustrates a system 250 including a processor device 220 with pin resources that provide a different channel configuration than the system 200, in accordance with one embodiment. As shown in FIG. 2B, the pin distribution between memory interfaces and network interfaces is a 3:1 ratio. One of two interfaces on the network interface controller 205 is disabled and the memory controller 210-A is coupled to a memory device 230-C. In the system 250, the router device 270 may be smaller and simpler compared with the router device 225 because the router device 270 has fewer connections to the processor device 220. Alternatively, the system 250 may employ the same router device as the system 200, but adjust which processors are connected to which slices of each router, or the system may use the same router devices in the same configuration, but reduce the number of parallel network slices.

As shown in FIG. 2B, the plurality of pin resources 215-A is coupled to the network interface controller 205 to provide configurable channels between the network interface controller 205 and the router device 270. The sets of pin resources 215-B, 215-C, and 215-D are each coupled to the three memory controllers 210 in the storage system to provide a configurable channel between the memory controller 210-A and a memory device 230-C, the memory controller 210-B and a memory device 230-B, and the memory controller 210-C and a memory device 230-A.

While the systems 200 and 250 have network and memory channel widths that are the same, i.e., the number of pins in each plurality of pin resources 215 equals the width of each interface of a memory controller 210 and a network interface controller 205, the configurable channels-approach allows for different channel widths. For example, if the memory channel width is wider than the network channel width, one memory channel can be exchanged for multiple network channels. In other words, a single plurality of pin resources 215 may be configured to provide a single memory channel or multiple network channels.

Dynamic reconfiguration where pins are redeployed between memory and network by reconfiguring a plurality of pin resources 215 when the system 200 or 250 is in the field is also possible. However, dynamic reconfiguration requires over-provisioning of memory and network resources outside of the processor device 220 to accommodate the maximum potential bandwidth of either subsystem.

To allow dynamic reconfiguration or coupling of different controllers to different sets of pin resources 215 after the die containing the integrated circuits of the processor device 220 is fabricated and packaged, the sets of pin resources 215 are designed to selectively connect a set of pads to a controller interface to configure a channel. The plurality of pin resources 215 is coupled to circuitry for multiplexing among two or more high-speed interfaces (e.g., network and/or memory interfaces), specifically to flexibly allocate pins and/or bandwidth among the different high-speed interfaces. One or more signals of a channel may be uni-directional or bi-directional for transmitting data, clock, and/or control signals of an interface. The channels may support full duplex or half duplex transmissions. Furthermore, dynamic reconfiguration may also necessitate additional circuitry in the devices that are coupled to the channels, such as the router device 270 and the memory devices 230. For example, the additional circuitry may include tri-state drivers to ensure that a communication channel of a router device 270 or a memory device 230 that is not enabled does not drive a wire connected to a shared pin on the processor device 220. Although, the configurable pins resources are described as residing within the processor device 210, persons skilled in the art will understand that other integrated circuit devices, such as the memory devices 230, router device 270, and/or another type of integrated circuit device may include configurable pin resources.

Figure 3A:
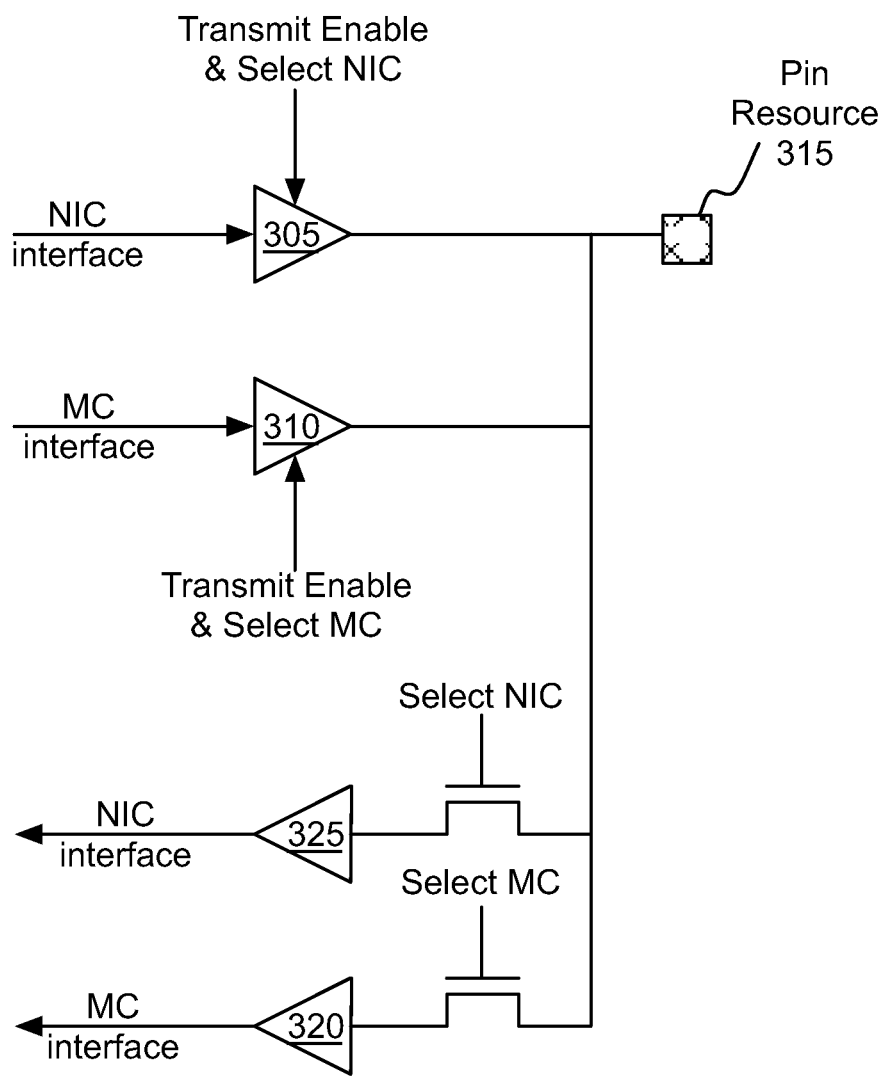
FIG. 3A illustrates a pin resource that is coupled to transmitter and receiver circuits for two different interfaces, in accordance with one embodiment.

FIG. 3A illustrates a pin resource 315 that is coupled to transmitter and receiver circuits for two different interfaces, in accordance with one embodiment. As shown in FIG. 3A, only the pin resource 315 (e.g., pad coupled to a pin) is shared by a NIC interface and a memory controller (MC) interface. The pin resource 315 represents a single pad and pin rather than a plurality of pin resources that form a channel. A transmitter circuit 305 receives a signal from the NIC interface and the transmitter circuit 305 drives the signal to a pad within the pin resource 315 when the transmitter circuit 305 is enabled (i.e., when a transmit enable signal is asserted and a select NIC signal is asserted). When the transmitter circuit 305 is enabled, a signal is transmitted from a device that includes the pin resource 315 on a communication path of the NIC interface. A transmitter circuit 310 receives a signal from the MC interface and the transmitter circuit 310 drives the signal to the pin resource 315 when the transmitter circuit 310 is enabled (i.e., when a transmit enable signal is asserted and a select MC signal is asserted). When the transmitter circuit 310 is enabled, a signal is transmitted from the device that includes the pin resource 315 on a communication path of the MC interface.

When the select NIC signal is asserted, a first transistor configured as a pass gate connects a receiver circuit 325 to the pin resource 315. The first transistor activates a path between the pad within the pin resource 315 and the receiver circuit 325 to receive a signal transmitted on a communication path of the NIC interface from a networking device to the device that includes the pin resource 315. The receiver circuit 325 transmits the signal to the network interface controller 205.

Likewise, when the select MC signal is asserted, a second transistor configured as a pass gate connects a receiver circuit 320 to the pin resource 315. The second transistor activates a path between the pad within the pin resource 315 and the receiver circuit 320 to receive a signal transmitted on a communication path of the MC interface from a memory device to the device that includes the pin resource 315. The receiver circuit 320 transmits the signal to the memory controller 210. Separate transmitter circuits and receiver circuits for each interface may be required if the electrical signaling levels or the signal timing requirements are dramatically different between the external router device 225 or 270 and the memory devices 230.

Figure 3B:
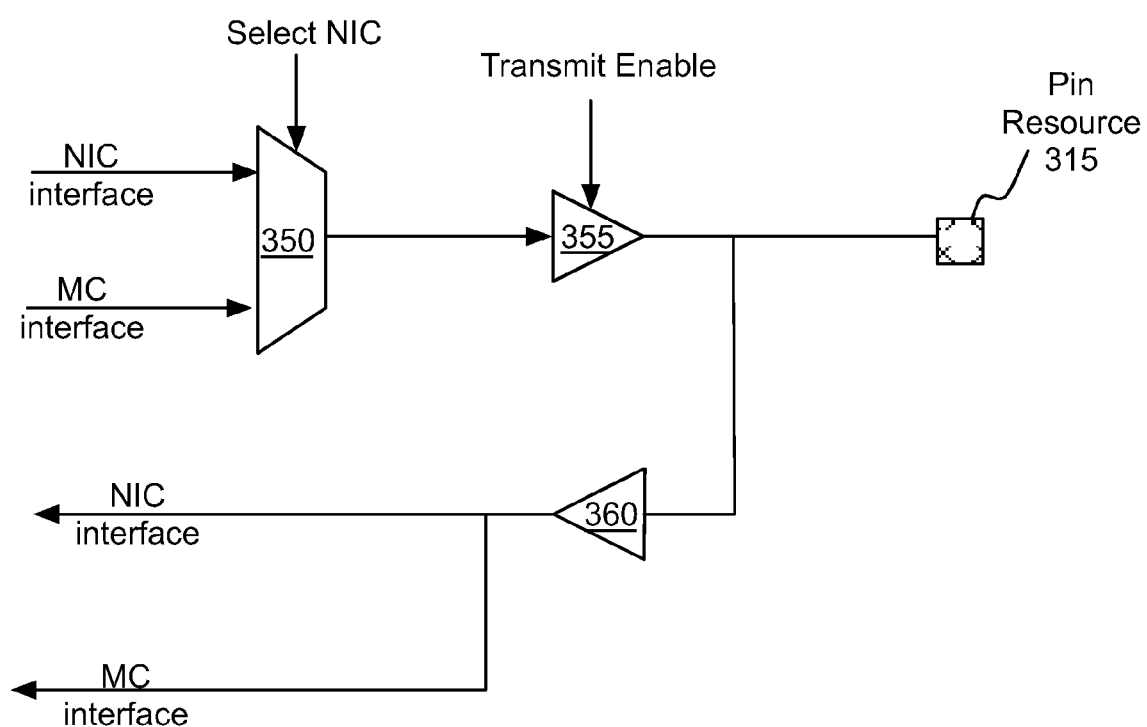
FIG. 3B illustrates a pin resource that is coupled to shared transmitter and receiver circuits for two different interfaces, in accordance with one embodiment.

FIG. 3B illustrates a pin resource 315 that is coupled to shared transmitter and receiver circuits for two different interfaces, in accordance with one embodiment. In one embodiment, the shared transmitter and receiver circuits may be configured to couple the pin resource 315 to additional interfaces. When the electrical and timing circuits are the same between two channels, the transmitter and receiver circuits can be shared for two different interfaces. A multiplexor is configured to select between a NIC interface input and a MC interface input based on the select NIC signal. The selected input is transmitted to the pin resource 315 by a transmitter circuit 355 when the transmit enable signal is asserted. The receiver circuit 360 routes the signal received by the pin resource 315 to both the NIC and MC interfaces as an input to the network interface controller 205 or memory controller 210, whichever controller is enabled. The transmitter circuits and receiver circuits may be factored into subcomponents of which subsets (e.g., a pad of the pin resource 315, at least a portion of the transmitter circuit 355, and/or at least a portion of the receiver circuit 360) may be shared between two or more controller interfaces depending on the commonality of electrical and timing design.

In one embodiment, the interface between the network interface controller 205 and the router device 225 may operate at a higher frequency than a DRAM device or a non-volatile storage device, so the memory devices 230 include expansion circuitry to demultiplex signals received from the memory channel and multiplex signals that are output to the memory channel. In one embodiment, the expansion circuitry is implemented as a separate device that is coupled between the channel and the memory devices 230.

A memory interface can be made wider in one of several manners. One technique, as shown in FIGS. 2A and 2B, provides extra memory controllers 210 that are enabled when a wider memory interface is specified for the processor device 220. When adding or subtracting memory controllers 210, the internal architecture of the processor device 220 provides an adjustable address mapping mechanism that allows a memory address to be sent to different memory controllers 210 by processing units within the processor device 220 depending on the number of memory controllers 210 that are enabled, i.e., coupled to a memory device 230 via a plurality of pin resources 215.

A second technique uses a fixed number of memory controllers 210, but allows the width of the memory interface to be adjusted. For example, when more pin resources are available, the memory interface for a given memory controller 210 may be extended from 64 to 96 bits. Implementing interface width configurability may require the memory controller 210 to accept variable width transfers from the memory device 230 (e.g., DRAM) and to be able to change how the memory device burst size is divided into individual memory transfers.

The network architecture may support flexibility of use in different systems. For example, when additional pin resources are available, the number of network links (e.g., channels) may be kept fixed, but the width of each link may be increased. Implementing flexible link widths may require the network interface controllers 205 to support variable width network channels, and to be able to pack and unpack messages for different width channels.

Another optional technique for supporting flexibility is to keep the network channel width fixed and vary the number of network channels exposed to the network infrastructure outside of the processor device, i.e., the router device 225 or 270. Such technique adjusts the number of network slices connected to the router device 225 or 270 and may require different numbers of routers for different systems. Modern system-level network topologies typically employ network slicing to increase path diversity and deliver better overall network bandwidth and performance than un-sliced networks.

Figure 4A:
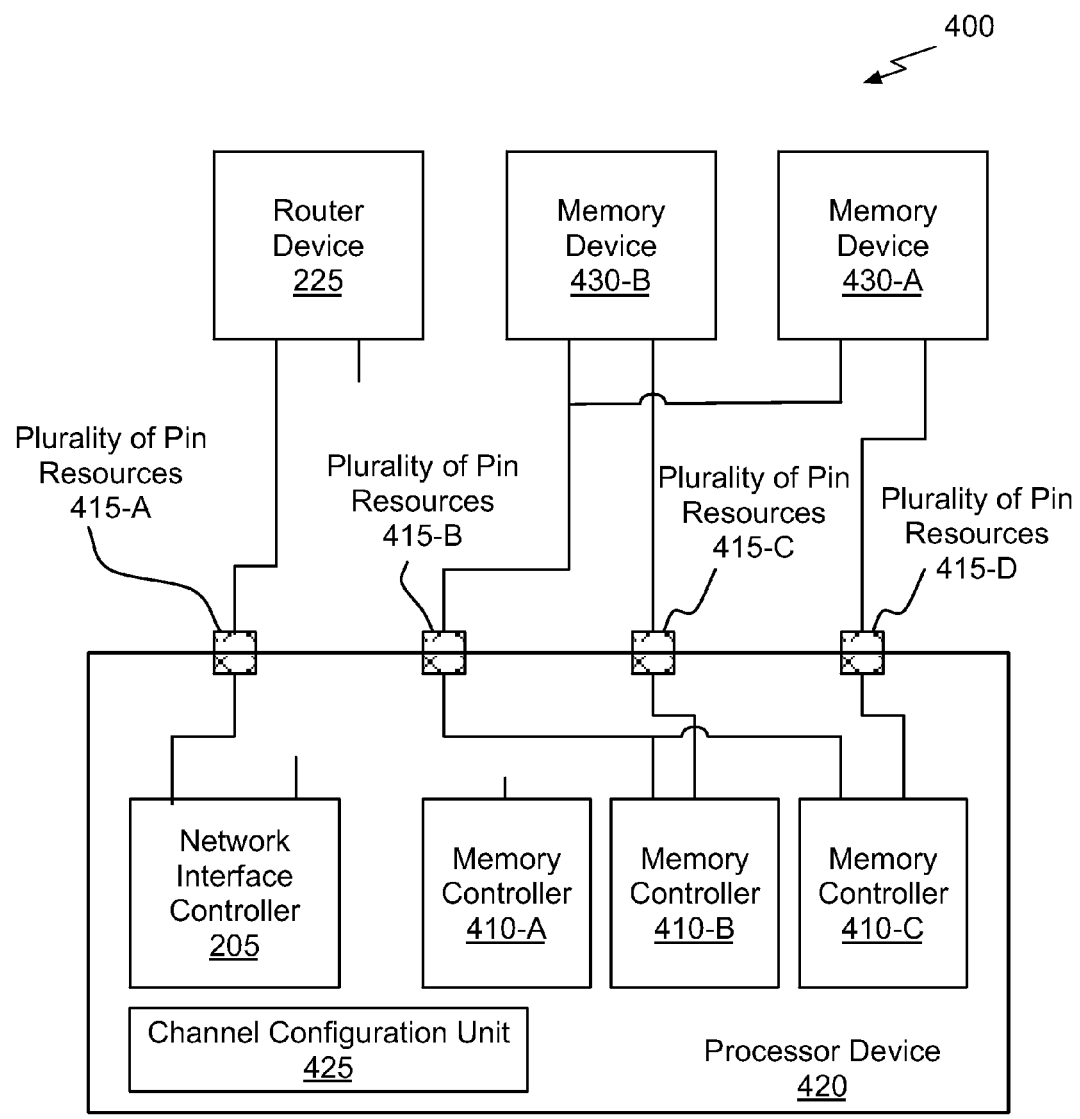
FIG. 4A illustrates a diagram of another system including a processor device with pin resources that provide a channel configuration, in accordance with one embodiment.

FIG. 4A illustrates another diagram of a system 400 including a processor device 420 with pin resources that provide a channel configuration, in accordance with one embodiment. The system 400 is similar to the system 200, in that a plurality of pin resources 415-B may be configured to provide a network channel or a memory channel. As shown in FIG. 4A, the plurality of pin resources 415-B has been split to increase the width of the memory interfaces between a memory controller 410-B and a memory device 430-B, and between a memory controller 410-C and a memory device 430-A. For example, the plurality of pin resources 415-B may be split so that the memory interface width increases from 64 bits to 96 bits. The memory controllers 410-B and 410-C may be designed to operate the memory interface at variable width, for example at 32, 64, or 96 bits. A channel configuration unit 425 includes circuitry that configures the plurality of pin resources 415 based on the pin distribution to provide a specific memory and or network channel configuration. Therefore, a single integrated circuit may be used to implement the processor devices 220 and 420. The single integrated circuit may be deployed to produce each of the systems 200, 250, and 400. In the system 400, the extra memory controller 410-A is disabled and may be gated off from a power supply and/or clock. The memory devices 430 may be implemented as dynamic random access memory (DRAM) devices or non-volatile memory or storage devices.

Figure 4B:
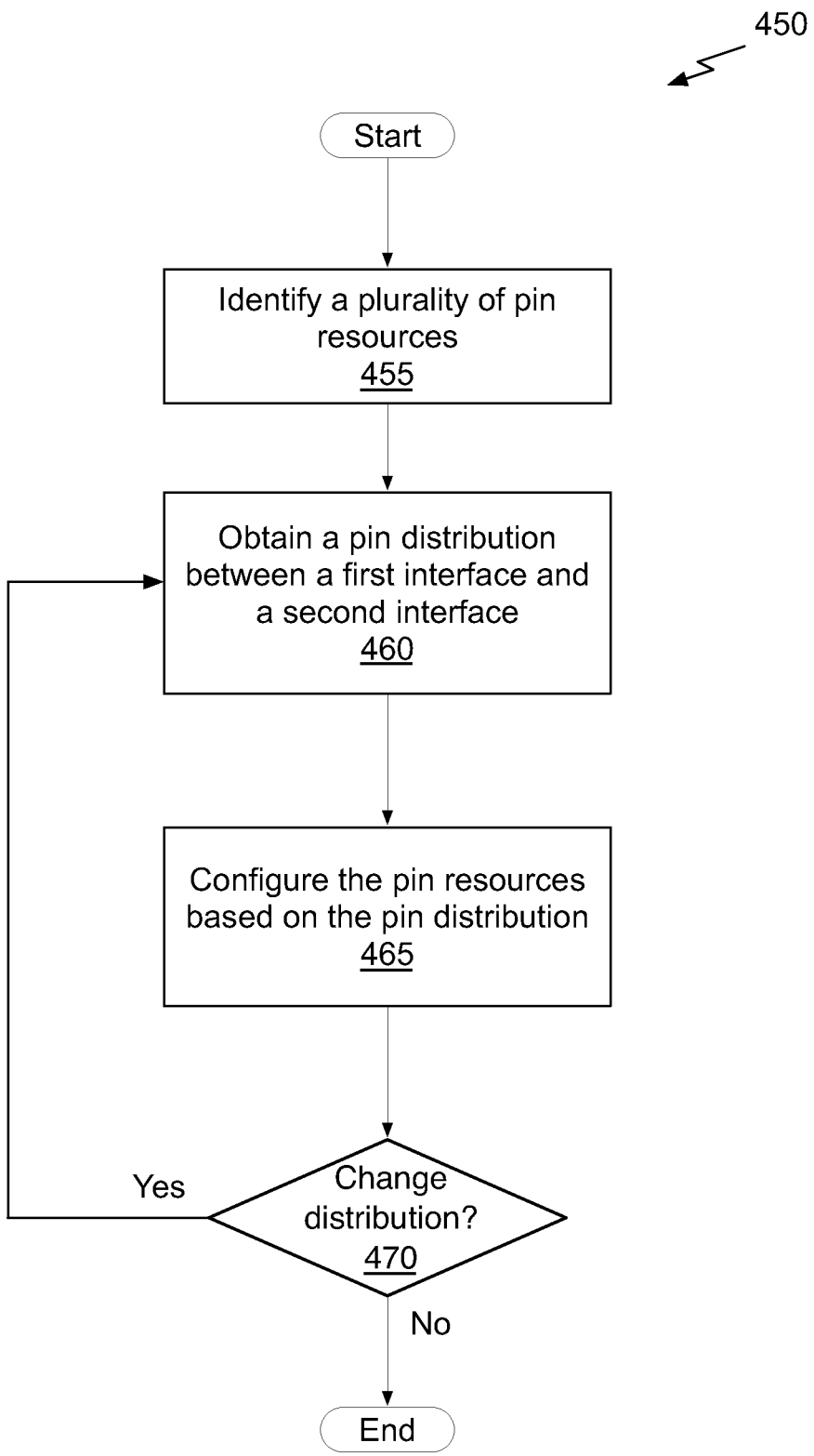
FIG. 4B illustrates a flowchart of a method for dynamically configuring communication channels between a processor device and multiple other devices using a set of off-chip pin resources, in accordance with one embodiment.

FIG. 4B illustrates a flowchart 100 of a method for configuring a plurality of pin resources, in accordance with one embodiment. The operations 455, 460, and 465 are performed in the same manner as operations 105, 110, and 120, as previously described in conjunction with FIG. 1. At operation 470, the channel configuration unit 425 determines if the pin distribution has changed, and, if not, the configuration process terminates. The pin distribution may change in response to a change in a bandwidth requirement for one or more channels. Otherwise, channel configuration unit 425 returns to operation 460 to adjust the channel configuration based on the updated pin distribution. The channel configuration unit 425 may configure one or more sets of pin resources 215 or 415 to change from providing a memory channel to a network channel or vice versa. In one embodiment, the channel configuration unit 425 may split a plurality of pin resources 215 or 415 between one or more different channels to change the width of a channel.

In one embodiment, the plurality of pin resources are implemented to provide configurable channels through generic input/output (I/O) links as an extension to an on-chip network within the processor device 220. More specifically, the I/O controllers (e.g., the NIC 205 and memory controller 210) are implemented on a different device or devices. These additional devices or device may be placed in the same package as the die containing the circuitry for the processor device 220, or the additional devices or device may be located elsewhere on a system substrate (e.g., printed circuit board, silicon interposer, or multi-chip module substrate). In one embodiment, the additional devices or device may be included in a chip stack.

Figure 5A:
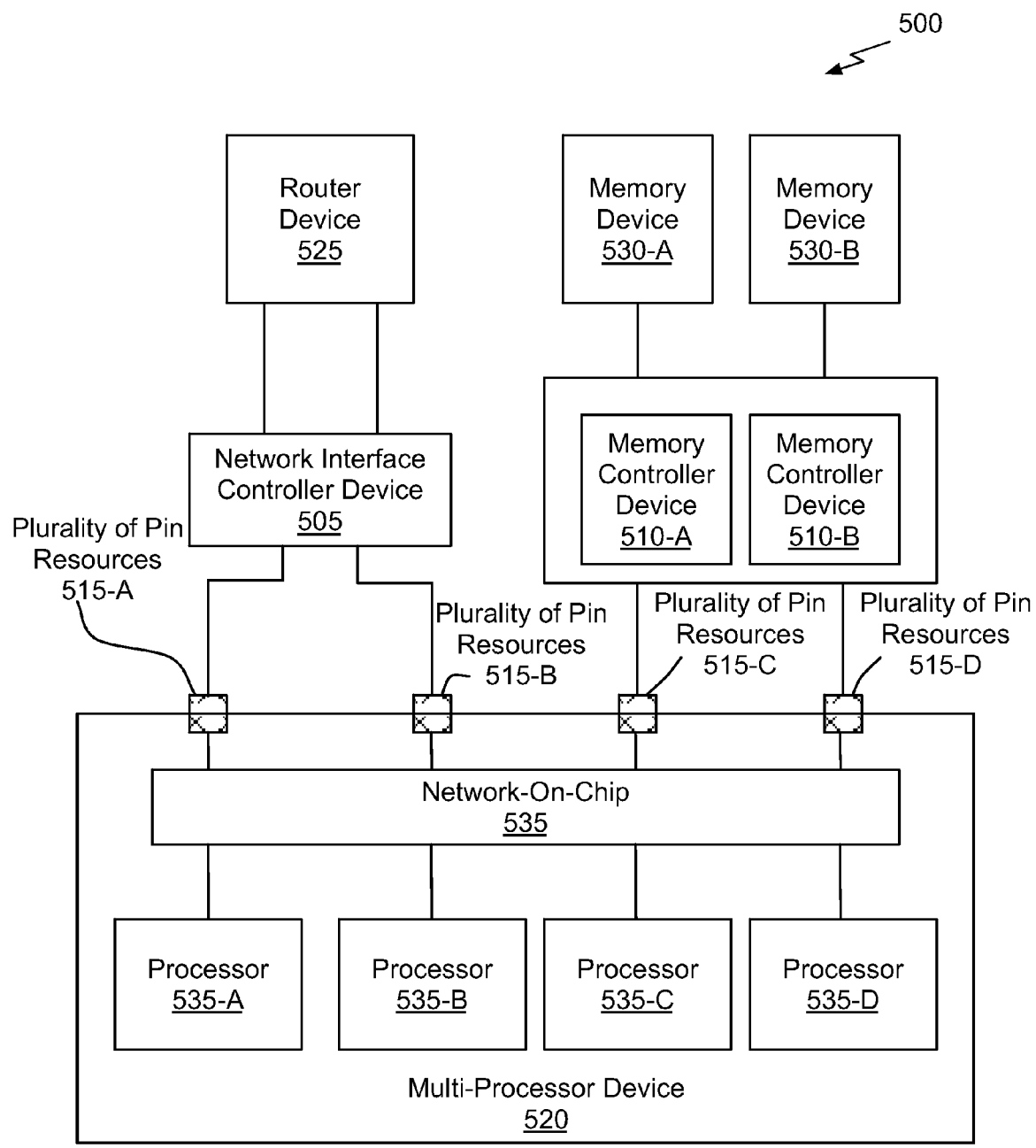
FIG. 5A illustrates a diagram of a processor chip with off-chip pins that provide a first channel configuration using generic input/output links, in accordance with one embodiment.

FIG. 5A illustrates a diagram of a system 500 including a multi-processor device 520 with sets of pin resources 515 that provide a channel configuration using generic I/O links, in accordance with one embodiment. The multi-processor device 520 includes four processors 535-A, 535-B, 535-C, and 535-D that are connected to a network-on-chip (NOC) 535 that includes connections to external devices through sets of pin resources 515. Two channels provided by the plurality of pin resources 515-A and 515-B connect two interfaces of the NOC 535 to a network interface controller device 505 that is coupled to a router device 525. Two other channels that are provided by the plurality of pin resources 515-C and 515-D connect two other interfaces of the NOC 535 to one or more memory controller devices 510-A and 510-B that are coupled to memory devices 530-A and 530-B. The routing implemented by the NOC 535 may be changed based on the configuration of the sets of pin resources 515, so that network communications are routed to a network channel and storage communications are routed to a memory channel.

Figure 5B:
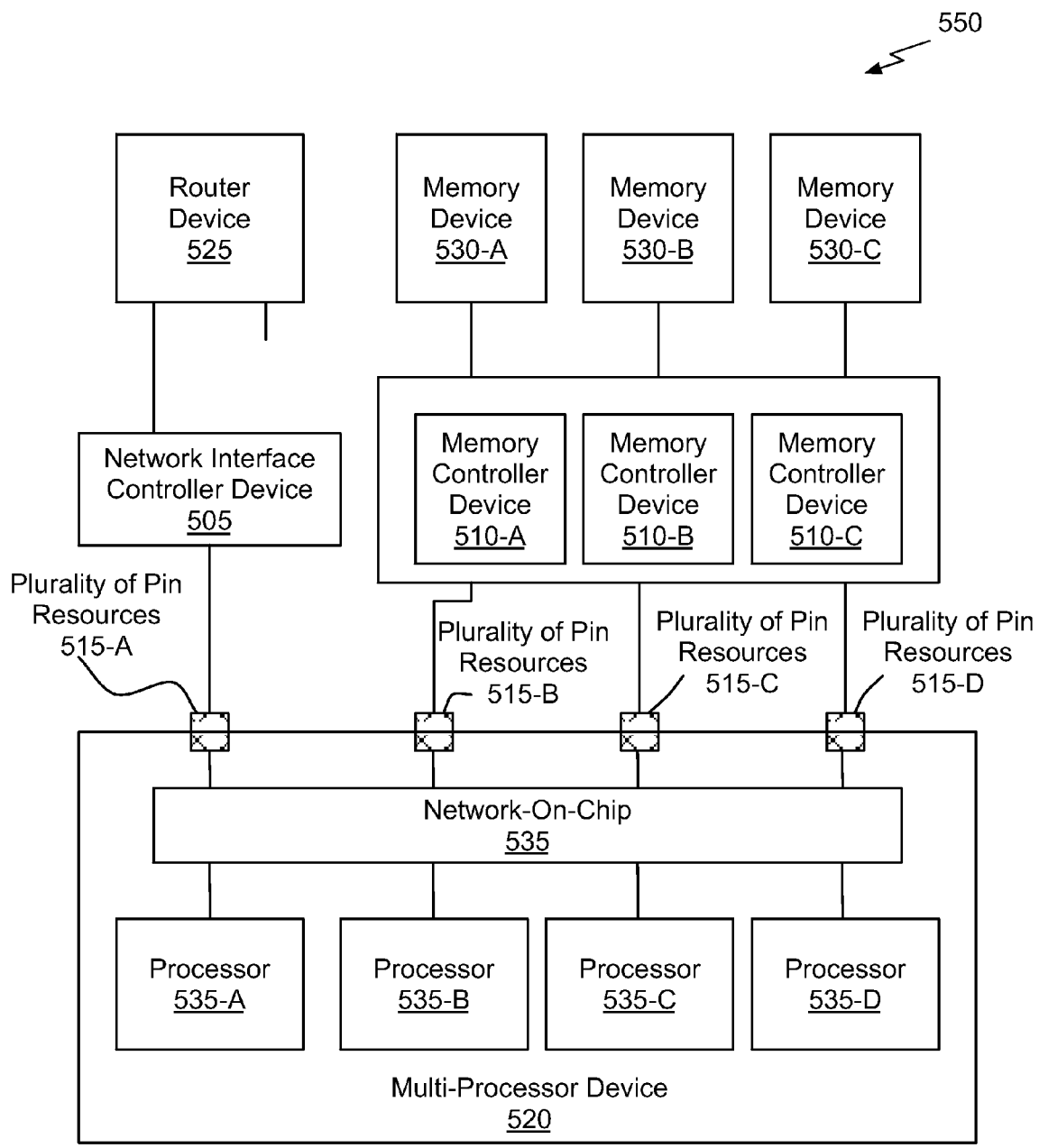
FIG. 5B illustrates a diagram of a system including a multi-processor device with sets of pin resources that provide a channel configuration using generic I/O links, in accordance with one embodiment.

FIG. 5B illustrates another diagram of a system 550 including multi-processor device 520 with sets of pin resources 515 that provide a channel configuration using generic I/O links, in accordance with one embodiment. The system 550 includes an additional memory controller device 510-C and a corresponding memory device 530-C. The plurality of pin resources 515-B provides a memory channel between the NOC 535 and the additional memory controller 510 instead of a network channel between the NOC 535 and the NIC device 505. The electrical interfaces of the channels provided by the sets of pin resources 515-A, 515-B, 515-C, and 515-D are the same as for the system 500, however address mapping tables within the multi-processor devices 520 are different to accommodate the additional memory controller device 510. For example, memory traffic can be address interleaved across the two memory channels provided by the sets of pin resources 515-C and 515-D in the system 500 and across three memory channels provided by the sets of pin resources 515-B, 515-C, and 515-D in the system 550. Network traffic can be routed through either of the network channels provided by the sets of pin resources 515-A and 515-B in the system 500. In system 550, the network traffic can only be routed through the network channel provided by the plurality of pin resources 515-A.

The channels provided by the sets of pin resources 215 or 515 may be reconfigured while a system is deployed in the field to transfer bandwidth capacity from the network devices to the storage system or from the storage system to the network devices. Dynamic reconfiguration capability may require extra network channels that can be enabled or disabled and/or extra memory channels that can be enabled or disabled. Dynamic reconfiguration capability may also require active circuits outside of the processor device 220 or multi-processor device 520 that selectively connect the network and memory channels to the sets of pin resources 215 and 515, respectively. Because of the extra system costs associated with overprovisioning network bandwidth and memory bandwidth/capacity, supporting dynamic reconfiguration in the field may currently not be worthwhile in some systems. Instead, a variety of different configurations may be more commonly used to employ the same processor device 220 or multi-processor device 520 in systems that have different network and memory bandwidth demands.

Figure 6:
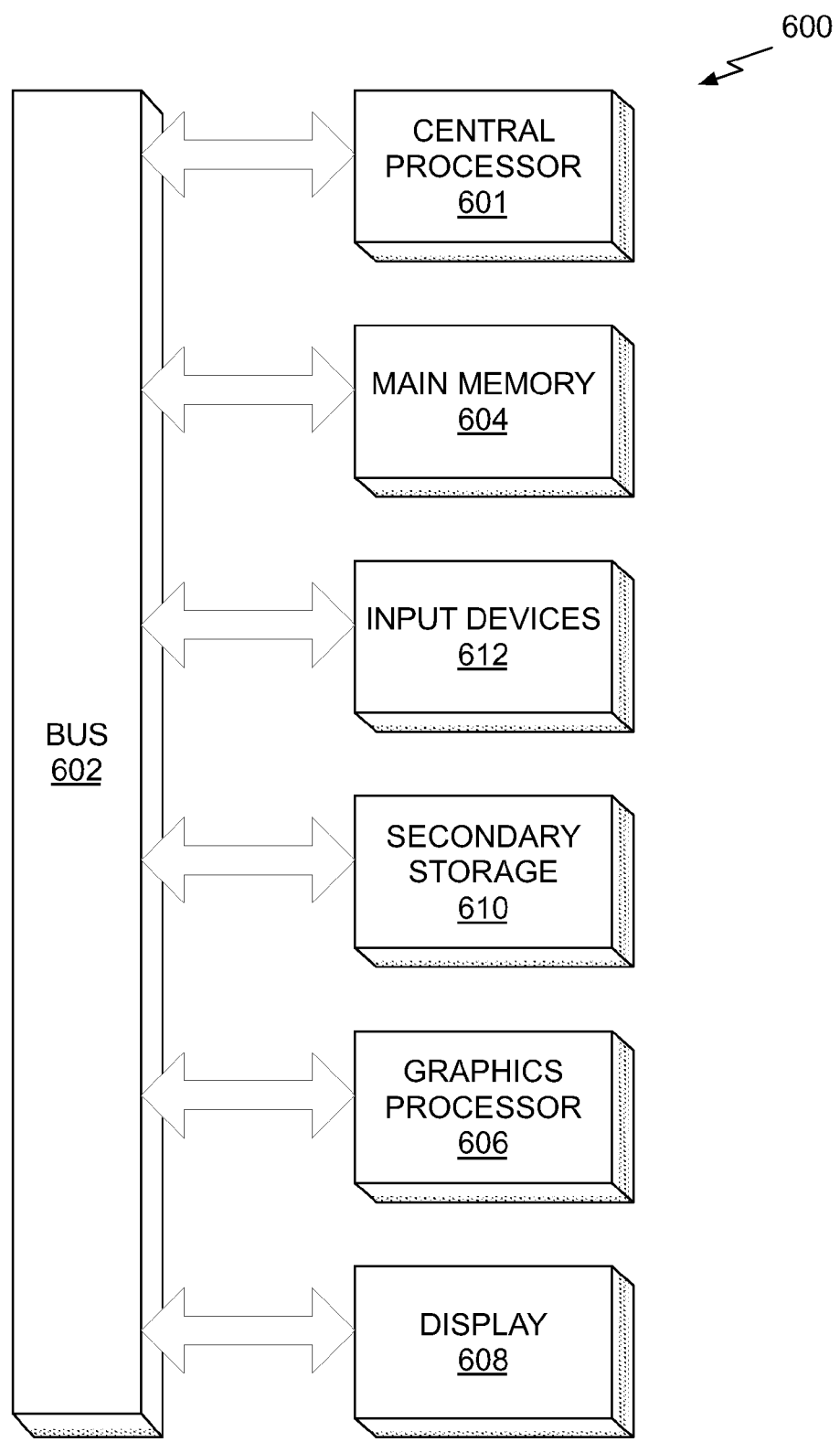
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s) between two or more of the system components (e.g., central processor 601, main memory 604, graphics processor 606, display 608, input devices 612, secondary storage 610, and the like). In one embodiment, one or more channels of the communication bus 602 may be implemented using channels that are configured based on a pin distribution using the process described in conjunction with FIGS. 1 and/or 4B. The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc.

One or more of the components shown in FIG. 6 may be included in a single semiconductor platform so that die or chips embodying the components are coupled to each other through a system substrate. In the present description, a system substrate may refer to a printed circuit board, multi-chip module substrate, silicon interposer, or a chip stack. Of course, the various components may also be situated separately or in various combinations of system platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
 identifying a plurality of pin resources of a primary application specific integrated circuit (ASIC) device; and
 configuring the plurality of pin resources based on a pin distribution between a first interface and a second interface, wherein the first interface provides a first communication path between the primary ASIC device and a first device and the second interface provides a second communication path between the primary ASIC device and a second device.

2. The method of claim 1, wherein the first device is a non-volatile storage device and the first communication path is between the storage device and a memory controller circuit within the primary ASIC device.

3. The method of claim 1, wherein the first device is a memory device and the first communication path is between the memory device and a memory controller circuit within the primary ASIC device.

4. The method of claim 3, wherein the first device includes expansion circuitry that is coupled between the first communication path and one or more memory devices.

5. The method of claim 1, wherein the first device is a memory controller device and the first communication path is between the memory controller device and a network-on-chip circuit that is included within the primary ASIC device.

6. The method of claim 1, wherein the second device is a router device and the second communication path is between the router device and a network interface controller circuit within the primary ASIC device.

7. The method of claim 1, wherein the second device is a network interface controller device and the second communication path is between the network interface controller device and a network-on-chip circuit that is included within the primary ASIC device.

8. The method of claim 1, wherein the configuring of the pin resources comprises:
enabling a first transmitter circuit of two transmitter circuits to provide a first signal to a first pad within the plurality of pin resources to transmit the first signal from the primary ASIC device to the first device on the first communication path; and
activating a path between the first pad and a first receiver circuit of two receiver circuits to receive a second signal transmitted from the first device to the primary ASIC device on the first communication path.

9. The method of claim 1, wherein the configuring of the pin resources comprises:
selecting a first signal of the first interface for input to a transmitter circuit that is coupled to a first within the plurality of pin resources to transmit the first signal from the primary ASIC device to the first device on the first communication path; and
receiving a second signal transmitted from the first device to the primary ASIC device on the first communication path at an input to a receiver circuit within the primary ASIC device that is coupled to the first interface and the second interface.

10. The method of claim 1, wherein the first communication path is a channel configured to provide one or more bi-directional paths between the primary ASIC device and the first device.

11. The method of claim 1, further comprising:
determining that the pin distribution has changed; and
reconfiguring the plurality of pin resources based on the changed pin distribution.

12. The method of claim 11, wherein the reconfiguring of the plurality of pin resources comprises:
splitting the plurality of pin resources into a first subset of pin resources and a second subset of pin resources;
configuring the first subset of pin resources to provide at least a portion of the first communication path; and
configuring the second subset of pin resources to provide at least a portion of the second communication path.

13. The method of claim 1, wherein the configuring of the plurality of pin resources comprises:
coupling a first quantity of channels provided by the plurality of pin resources to a memory controller circuit within the primary ASIC device; and
coupling a second quantity of channels provided by the plurality of pin resources to a network interface controller circuit within the primary ASIC device, wherein a distribution of the channels specified by the first quantity and the second quantity equals the pin distribution.

14. A system, comprising:
a first device;
a second device; and
a primary application specific integrated circuit (ASIC) device comprising a plurality of pin resources, wherein the plurality of pin resources is configured based on a pin distribution between a first interface that provides a first communication path between the primary ASIC device and the first device and a second interface that provides a second communication path between the primary ASIC device and the second device.

15. The system of claim 14, wherein the first device is a non-volatile storage device and the first communication path is between the storage device and a memory controller circuit within the primary ASIC device.

16. The system of claim 14, wherein the first device is a memory device and the first communication path is between the memory device and a memory controller circuit within the primary ASIC device.

17. The system of claim 14, wherein the first device is a memory controller device and the first communication path is between the memory controller device and a network-on-chip circuit that is included within the primary ASIC device.

* * * * *